(12) United States Patent
Kim et al.

(10) Patent No.: US 9,490,831 B2
(45) Date of Patent: Nov. 8, 2016

(54) TIME-TO-DIGITAL CONVERTER USING STOCHASTIC PHASE INTERPOLATION

(71) Applicant: SAMSUNG ELECTRONICS CO., LTD., Suwon-Si, Gyeonggi-Do (KR)

(72) Inventors: Sung-Jin Kim, Ulsan (KR); Jihyun Kim, Hwaseong-si (KR); Taeik Kim, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/817,727

(22) Filed: Aug. 4, 2015

(65) Prior Publication Data

US 2016/0156362 A1 Jun. 2, 2016

(30) Foreign Application Priority Data

Dec. 1, 2014 (KR) ........................ 10-2014-0169873

(51) Int. Cl.
*H03L 7/06* (2006.01)
*H03L 7/189* (2006.01)
*G04F 10/00* (2006.01)

(52) U.S. Cl.
CPC ............ *H03L 7/189* (2013.01); *G04F 10/005* (2013.01)

(58) Field of Classification Search
CPC ...................................................... H03L 7/189
See application file for complete search history.

(56) References Cited

U.S. PATENT DOCUMENTS

| 7,808,418 B2 | 10/2010 | Sun et al. |
| 7,884,751 B2 | 2/2011 | Shimizu et al. |
| 8,797,203 B2 | 8/2014 | Lee |
| 2014/0232827 A1 | 8/2014 | Kumar et al. |
| 2016/0049946 A1* | 2/2016 | Liao ...................... G04F 10/005 327/149 |

OTHER PUBLICATIONS

Sung-Jin Kim et al., "A 0.6V 1.17ps PVT-Tolerant and Synthesizable Time-To-Digital Converter Using Stochastic Phase Interpolation With 16x Spatial Redundancy in 14nm FinFET Technology", 2015 IEEE International Solid-State Circuits Conference on Feb. 24, 2015, pp. 15-17.
Sung-Jin Kim et al., "A 0.63ps, 12b, Synchronous Cyclic TDC Using a Time Adder for On-Chip Jitter Measurement of a SoC in 28nm CMOS Technology", 2014 Symposium on VLSI Circuits Digest of Technical Papers on Jun. 10-13, 2014.
Hayun Chung et al., "A 10-Bit 80-MS/s Decision-Select Successive Approximation TDC in 65-nm CMOS", IEEE Journal of Solid-State Circuits, vol. 47, No. 5, May 2012, pp. 1232-1241.

(Continued)

*Primary Examiner* — Daniel Puentes
(74) *Attorney, Agent, or Firm* — F. Chau & Associates, LLC

(57) ABSTRACT

Provided is a time-to-digital converter. The time-to-digital converter includes several delay circuits, an adder configured to count outputs of the delay circuits, and a least significant bit (LSB) truncation circuit configured to truncate a predetermined number of LSBs from a result output by the adder. The time-to-digital converter is configured to determine a time interval between a start signal and a stop signal within one cycle of a clock having a predetermined period.

20 Claims, 9 Drawing Sheets

(56) References Cited

OTHER PUBLICATIONS

Luca Vercesi et al., "Two-Dimensions Vernier Time-To-Digital Converter", IEEE Journal of Solid-State Circuits, vol. 45, No. 8, Aug. 2010, pp. 1504-1512.

KwangSeok Kim et al., "A 9 bit, 1.12 ps. Resolution 2.5 b/Stage Pipelined Time-to-Digital Converter in 65 nm CMOS Using Time-Register", IEEE Journal of Solid-State Circuits, vol. 49, No. 4, Apr. 2014, pp. 1007-1016.

* cited by examiner

TIME-TO-DIGITAL CONVERTER USING STOCHASTIC PHASE INTERPOLATION

CROSS-REFERENCE TO RELATED APPLICATION

This application claims priority under 35 U.S.C. §119 to Korean Patent Application No. 10-2014-0169873 filed on Dec. 1, 2014, the disclosure of which is incorporated by reference in its entirety herein.

BACKGROUND

1. Technical Field

Embodiments of the inventive concept relate to a time-to-digital converter, and more particularly, to a time-to-digital converter with high performance.

2. Discussion of Related Art

A phase locked loop (PLL) is a control system that generates an output signal whose phase is related to the phase of an input signal, and has an important role in a digital system. A PLL may be based on a charge pump, which is a kind of DC to DC converter.

However, when a PLL is based on a charge pump, some of the operations it performs may be unstable due to its sensitivity to process, voltage, and temperature (PVT) variations.

SUMMARY

At least one embodiment of the inventive concept can provide a time-to-digital converter which is insensitive to PVT variations and has a high resolution operation.

According to an exemplary embodiment of the inventive concept, a time-to-digital converter includes a plurality of delay circuits, an adder and a least significant bit (LSB) truncation circuit. The time-to-digital converter is configured to determine a time interval between a start signal and a stop signal within one cycle of a clock having a predetermined period. The adder is configured to count outputs of the delay circuits. The least significant bit (LSB) truncation circuit is configured to truncate a predetermined number of LSBs from a result output by the adder.

In an embodiment, the delay circuits are connected in series.

In an embodiment, each delay circuit includes a delay element having a predetermined time delay, a logical product operator configured to perform an operation on an output of the delay element, the start signal and the stop signal, and output a result of the operation; and a latch configured to latch the output of the logical product operator.

In an embodiment, the clock is configured to pass through each delay element.

In an embodiment, a redundant delay element is present so bits more than a targeted number of bits can be output.

In an embodiment, the logical product operator is an AND gate.

According to an exemplary embodiment of the inventive concept, a time-to-digital converter includes a plurality of delay elements, a plurality of logical product operators, a plurality of latches, an adder and a LSB truncation circuit. The plurality of delay elements are configured to transmit a clock that is input at a predetermined period. The plurality of logical product operators are connected to outputs of the plurality of delay elements, respectively. The plurality of latches are configured to latch an output of the logical product operators. The adder is configured to count outputs of the plurality of latches. The LSB truncation circuit is configured to truncate an output of the adder to generate a target number of bits.

In an embodiment, the delay elements are connected in series.

In an embodiment, the number of the delay elements is larger than the number of target bits.

In an embodiment, the more delay elements the clock signal passes through, the more characteristic distributions of mismatch characteristics between the delay elements and jitter characteristic of delay signals of the clock signal passing through the delay elements become constant.

In an embodiment, the adder counts rising edges of delay signals of the clock signal passing through the delay elements in a predetermined interval between a start signal and a stop signal.

In an embodiment, the LSB truncation circuit truncates LSBs of output bits of the adder to be matched to a targeted number of bits.

In an embodiment, the start signal and the stop signal are activated and input after passing through all of the delay elements.

In an embodiment, the logical product operator receives and operates on outputs of the delay elements during an interval in which the start signal and the stop signal are activated while overlapping each other.

In an embodiment, the rising edges in the clock period are obtained regardless of the time delay of the delay element.

In an embodiment, the number of the rising edges in the clock period determines a resolution performance of the time-to-digital converter.

In a time-to-digital converter according to an exemplary embodiment of the inventive concept, when a start signal and a stop signal are buffered and provided with respect to a time interval desired to be measured, the converter is configured to quantize the number of rising edges of a clock that are counted within an interval between the start signal and the stop signal after a predetermined time elapse, and to convert the quantized number into a target number of bits.

In an embodiment, the time-to-digital converter includes a unit delay group provided with a plurality of delay elements and configured to provide delay signals, an adder configured to count a result of the unit delay group, and an LSB truncation circuit configured to truncate a predetermined number of LSBs from a result of the adder.

In an embodiment, the unit delay group includes a plurality of unit delays connected in series, and transmit a clock signal having a predetermined period through the unit delays.

In an embodiment, the unit delay includes a delay element having a predetermined time delay.

In an embodiment, the delay element additionally has a redundant delay element to output bits more than a targeted number of bits.

According to an exemplary embodiment of the inventive concept, a time-to-digital converter is configured to generate a digital code indicating a time interval between a start signal and a stop signal. The time-to-digital converter includes: a plurality of delay elements connected in series; a plurality of logic gates, where each gate receives the start signal, the stop signal, and an output of a corresponding one of the delay elements; a plurality of latches, where each latch receives an output of a corresponding one of the logic gates; an adder configured to add outputs of the latches; and a circuit configured to truncate an output of the adder to generate the digital code.

In an exemplary embodiment, the number of delay elements is higher than a total bit count of the digital code.

In an exemplary embodiment, a first one of the delay elements receives an input of a clock signal, and the adder adds the outputs during a single cycle of the clock signal.

In an exemplary embodiment, the time-to-digital converter includes an even number of delay elements connected in series and configured to output the start signal and an odd number of delay elements connected in series and configured to output the stop signal.

In an exemplary embodiment, a digital phase locked loop includes one of the above described time-to-digital converters.

BRIEF DESCRIPTION OF THE DRAWINGS

Exemplary embodiments of the inventive concept are described in further detail below with reference to the accompanying drawings in which like reference characters refer to the same parts throughout the different views. The drawings may not be to scale. An the drawings.

DETAILED DESCRIPTION

The inventive concept will now be described more fully with reference to the accompanying drawings. These inventive concepts may, however, be embodied in different forms and should not be construed as limited to the embodiments set forth herein.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

Hereinafter, exemplary embodiments of the inventive concept will now be described more fully with reference to the accompanying drawings.

Figure 1:
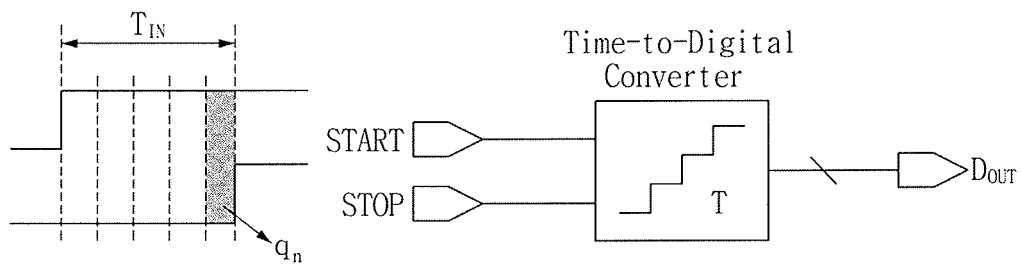
FIG. 1 is a conceptual view illustrating a general time-to-digital converter.

FIG. 1 is a conceptual view illustrating a general time-to-digital converter.

Referring to FIG. 1, a time-to-digital converter (hereinafter, referred to as a 'TDC') converts predetermined time information into a digital code $D_{OUT}$. The TDC may be used to measure the time interval between two different events and provide a digital representation (e.g., a digital code) of the time interval.

The TDC may generate a digital code from a value obtained by dividing a time interval $T_{IN}$ desired to be measured by a predetermined interval (e.g., a quantum $q_N$). For example, when the TDC is implemented, two input time signals START/STOP are received and phase information of a predetermined interval $T_{IN}$ is output as a digital code.

Use of an analog PLL, which is an analog circuit and is thus sensitive to PVT variations, may cause a malfunction. Performance of the analog PLL may be reduced, when threshold voltages of transistors are relatively higher than a power voltage of logic.

Accordingly, a digital PLL may be used to reduce sensitivity to the process variations, and thus the above described TDC may be used as a primary circuit of the digital PLL.

Figure 2A:
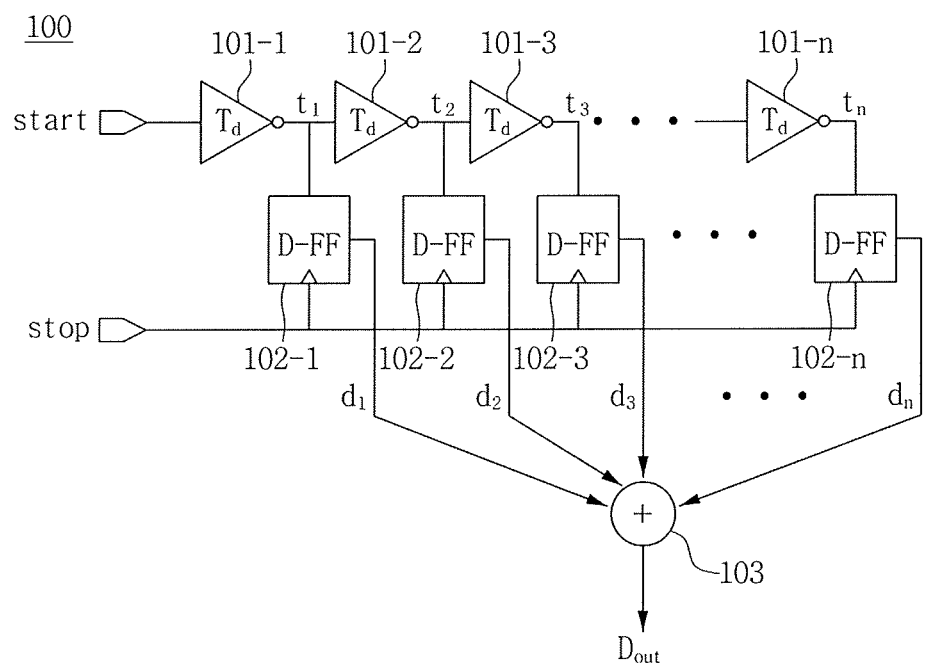
FIG. 2A is a circuit diagram illustrating an example of a TDC having a single delay line.

FIG. 2A is a circuit diagram illustrating an example of a TDC having a single delay line.

Referring to FIG. 2A, a TDC 100 includes two input signal lines, n inverters 101-1, 101-2, 101-3 to 101-n for signal delay, n latches 102-1, 102-2, and 102-3 to 102-n corresponding to the n inverters 101-1 to 101-n and provided using flip-flops, and an adder 103. The adder 103 may also be referred to as a summer, and is a circuit that performs addition on inputs to the circuit.

The TDC 100 receives two input signals, that is, a start signal and a stop signal of a time interval desired to be measured. The start signal is received first by the TDC 100, and then at a later time, the stop signal is received by the TDC 100.

Each of the inverters 101-1 to 101-n has a predetermined time delay Td, and operates such that the start signal is transmitted while being delayed by a predetermined time (t1, t2, t3, etc.) in the course of passing through the inverters 101-1 to 101-n. Accordingly, the start signal is delayed through each of n inverters 101-1 to 101-n, and outputs thereof are input into the respective latches 102-1 to 102-n.

The TDC 100 counts the number of rising edges of the start signal, which are output from being delayed by the n inverters 101-1 to 101-n, until a rising edge of the stop signal is activated, by using an adder 103, and outputs the result of the adder 103.

Figure 2B:
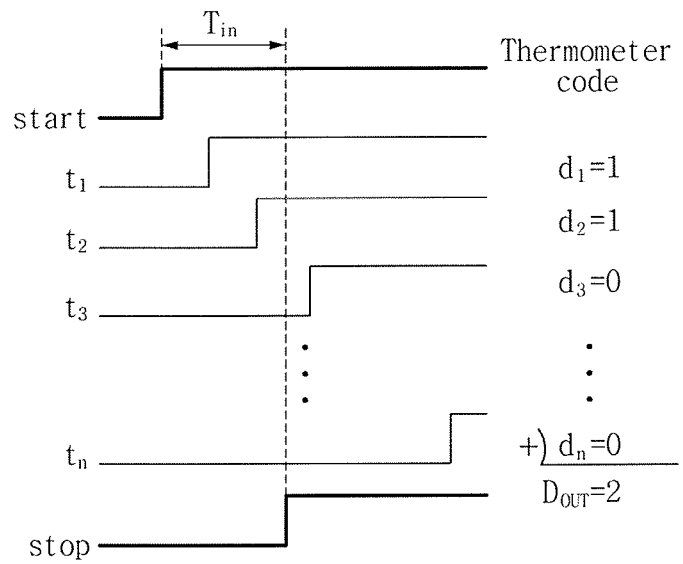
FIG. 2B is a view illustrating an operation diagram of a start signal and a stop signal and output result values according to FIG. 2A.

The output result value is shown in FIG. 2B as a digital code.

FIG. 2B is a view illustrating an operation diagram of a start signal and a stop signal and output result values according to FIG. 2A.

Referring to FIG. 2B, when delay signals of the start signal, that is, rising edges of t1, t2, t3, etc., are counted, two rising edges are counted until the stop signal is activated, and thus an output value $D_{OUT}$ is provided as 2.

When a delay value of each inverter is 1, a predetermined time interval $T_{IN}$ may be expressed as a digital code. Such a code providing scheme is referred to as a thermometer code, which is increased by 1 according to an increase in the number of rising edges as in a thermometer.

The TDC 100 is simply implemented and may provide a code intuitively, but the resolution is determined by the time delay of the inverters 101-1 to 101-n.

In general, the time delay of an inverter is determined by the size of a transistor used to implement the inverter. However, since there is a limitation in reducing a line width of the transistor in the process, the resolution of a TDC is limited by a minimum delay value of the inverter.

In other words, since the minimum line width of a transistor is under process limitations, there is difficulty in reducing the time delay as much as desired to increase the TDC resolution.

Figure 3:
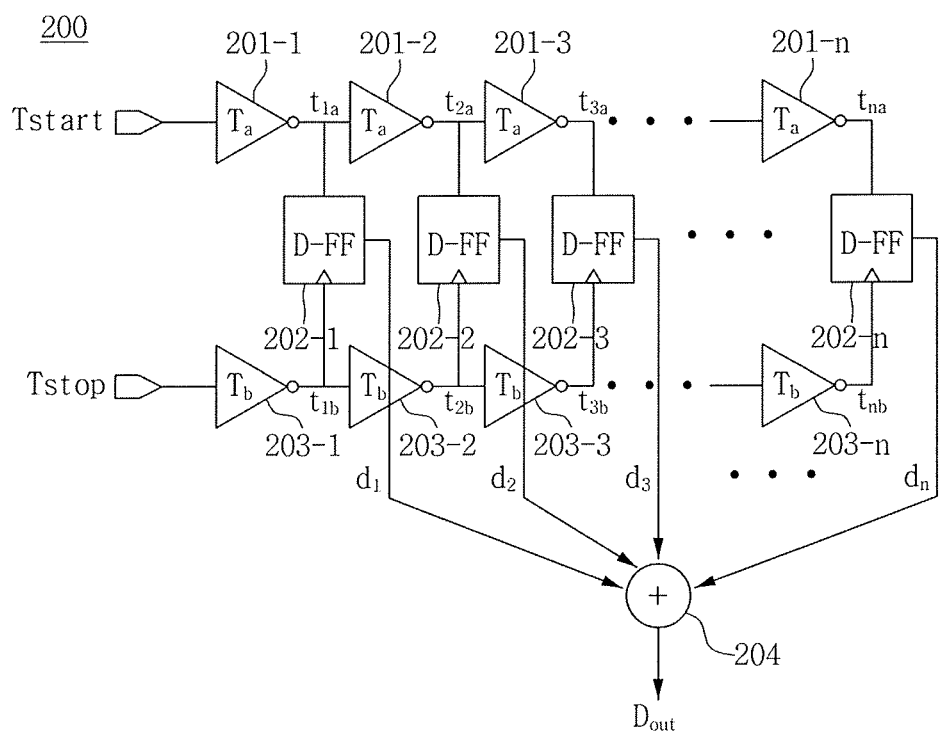
FIG. 3 is a circuit diagram of a vernier-type TDC.

FIG. 3 is a circuit diagram of a Vernier-type TDC.

Referring to FIG. 3, a Vernier-type TDC 200 includes two input signal lines, first n inverters 201-1, 201-2, and 201-3 to 201-n and second n inverters 203-1, 203-2, and 203-3 to 203-n for respective signal delays, n latches 202-1, 202-2, and 202-3 to 202-n corresponding to the first n inverters 201-1 to 201-n and the second n inverters 203-1 to 203-n and provided using flip-flops, and an adder 204.

The vernier-type TDC 200 may use a time delay difference between a start signal Tstart and a stop signal Tstop to minimize a unit time for quantization. For example, a start signal Tstart may pass through n inverters 201-1 to 201-n each having a first time delay ta, and a stop signal Tstop may pass through n inverters 203-1 to 203-n each having a second time delay tb. In this case, when the first time delay ta is larger than the second time delay tb, a time interval is quantized in a unit time of ta-tb.

In more detail, the first n inverters 201-1 to 201-n and the second n inverters 203-1 to 203-n are respectively connected to reference signal input ends and control signal input ends of the latches 202-1 to 202-n, and are configured to have a common signal output end. For example, the first n inverters 201-1 to 201-n are connected to data input terminals of the latches 202-1 to 202-n, and the second n inverters 203-1 to 203-n are connected to clock terminals of the latches 202-1 to 202-n. Such a TDC has a structure in which one pair of inverters is coupled to a D-flip flop D-FF. For example, a first pair of inverters 201-1 and 203-1 is coupled to the first D-flip flop 202-1, a second pair of inverters 201-2 and 203-2 is coupled to the second D-flip flop 202-2, etc.

Accordingly, the TDC 200 may receive a start signal Tstart and a stop signal Tstop that have a reference phase difference ta-tb, and the start signal Tstart is input into the n inverters 201-1 to 201-n each having the first time delay ta. In addition, the stop signal Tstop is input into the n inverters 203-1 to 203-n each having the second time delay tb.

In this case, the latches 202-1 to 202-n latch a plurality of delay signals t1a, t2a, t3a, etc. each delayed by the first time delay to by using a plurality of delay signals t1b, t2b, t3b, etc. each delayed by the second time delay tb, and generates an output signal.

In this case, when the number of the latches 202-1 to 202-n is n, the phase difference between the start signal Tstart and the stop signal Tstop is calculated as n*(ta−tb).

Accordingly, for the vernier-type TDC 200, the phase difference ta−tb of the start signal Tstart and the stop signal Tstop is the minimum time delay that may be resolved by the TDC.

Although the reducing of a time delay of each inverter is limited by process factors, a time delay difference between two signals may be adjusted as desired. In this manner, a time interval may be quantized based on the minimum time delay, thereby implementing a TDC of a high resolution while overcoming the process limitations.

However, in this case, the number of latches and the inverters coupled to the latches are great, and thus the power consumption is increased. In addition, due to mismatch between the inverters coupled to each other in series, a linear output performance of the TDC is not ensured.

Since that is the case, a calibration circuit to adjust a time delay error of the inverters needs to be additionally provided.

Figure 4A:
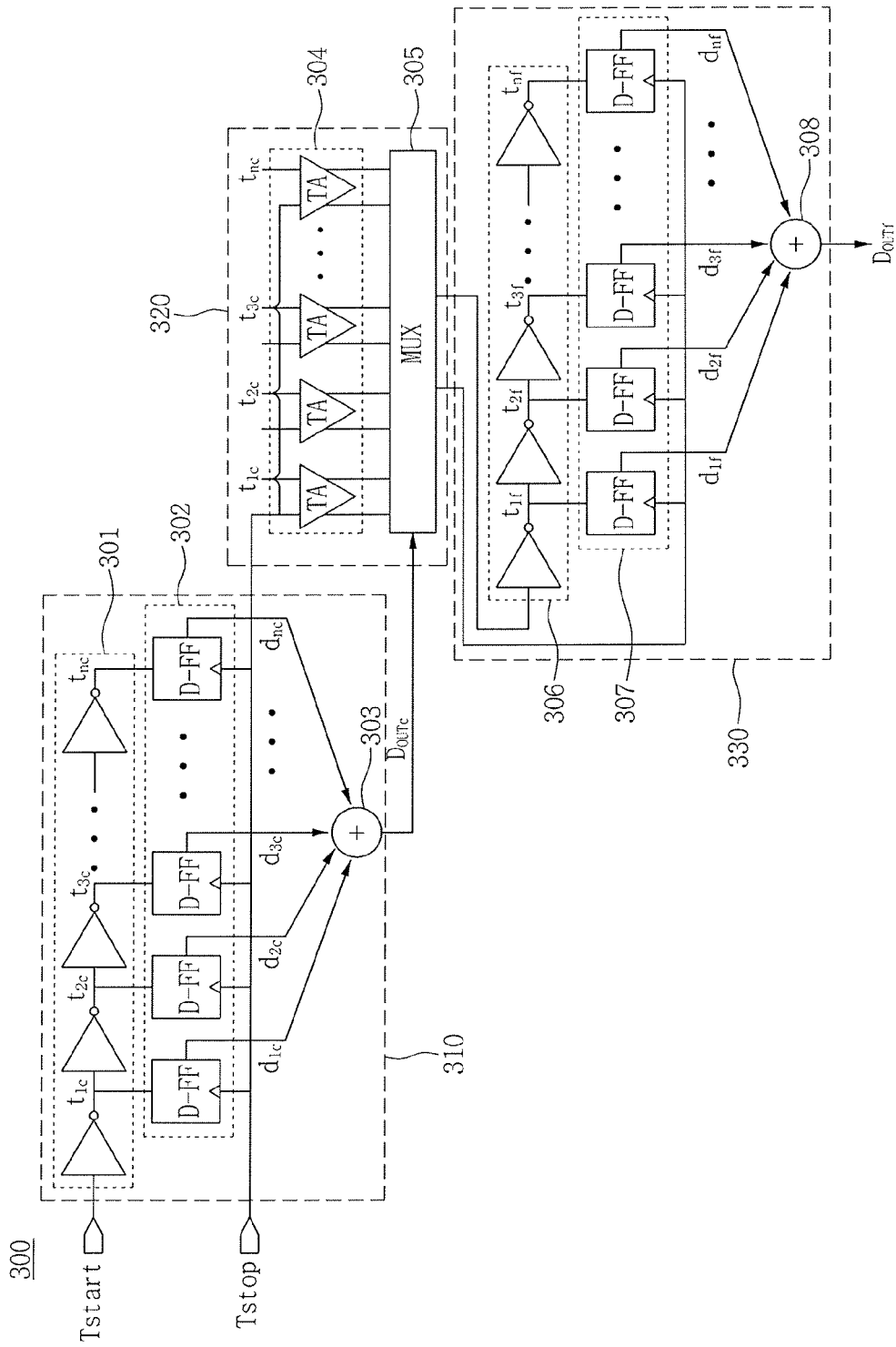
FIG. 4A is a circuit diagram of a general multi stage TDC.
Figure 4B:
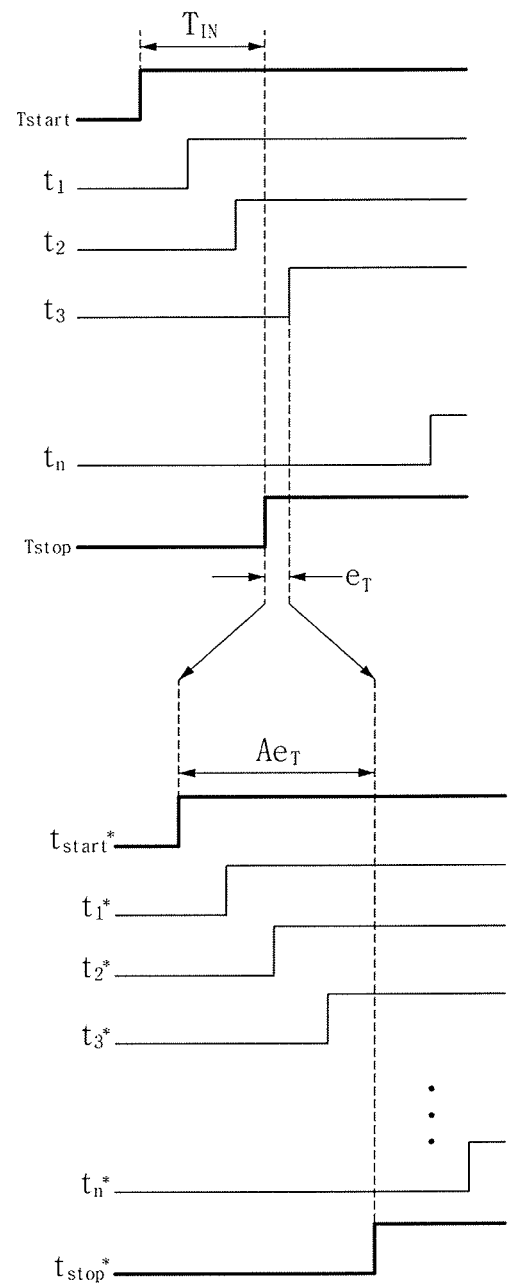
FIG. 4B is an operation timing diagram according to FIG. 4A.

FIG. 4A is a circuit diagram of a general multi-stage TDC, and FIG. 4B is an operation timing diagram according to FIG. 4A.

A multi-stage TDC 300 is provided to overcome the limitation of minimum time delay of delay elements (e.g., inverters) by amplifying input time using a time amplifier TA.

Referring to FIGS. 4A and 4B, the multi-stage TDC 300 includes a most significant bit (MSB) determiner 310, a time amplifier 320 and a least significant bit (LSB) determiner 330.

The MSB determiner 310 may have a structure similar to that of the TDC described in FIG. 2A, and detailed descriptions thereof will be omitted. The MSB determiner 310 includes two input signal lines, n inverters 301 for signal delay, n latches 302 and an adder 303. Delay signals t1c, t2c, t3c, etc. delayed through the inverters 301 are output. Latch signals d1c, d2c, d3c, etc. latched through the latches 302 are output.

The time amplifier 320 includes n time amplifying devices 304 (e.g., amplifiers) and a multiplexer (MUX) 305. The time amplifier 320 amplifies a predetermined time by using the delay signals t1c, t2c, t3c, etc. and the stop signal $t_{stop}$.

The LSB determiner 330 includes two signal lines output from the multiplexer MUX 305, n inverters 306 for signal delay, n latches 307 and an adder 308. The digital code $D_{OUTc}$ output by the adder 303 is provided to the MUX 305 to control which of the input signals from the amplifying devices 304 is output by the MUX 305. The LSB determiner 330 provides a final digital code $D_{OUTf}$ based on latch signals d1f, d2f, d3f, and dnf provided by the n latches 307, where the latches 307 receive delay signals t1f, t2f, t3f, and tnf based on a signal output from the MUX 305.

According to the operation of the multi-stage TDC 300, the MSB determiner 310, similar to the description of FIG. 2A, counts the number of rising edges of a start signal Tstart, which are output from being delayed by the n inverters 301, until a rising edge of a stop signal Tstop is activated, using an adder 303, and outputs the result of the adder 303.

Meanwhile, the time amplifier 320 detects a time interval until a first rising edge after a stop signal Tstop is activated, and amplifies the time interval.

When the first rising edge after the stop signal Tstop is activated is a rising edge of t3 signal, and the time difference between the activation of the stop signal and the rising edge of t3 signal is defined as an error time $e_T$, the error time $e_T$ is amplified using the time amplifying devices 304 to generate an amplified error time $A_{eT}$. The amount of amplification may be determined by gains of the time amplifying devices 304.

Accordingly, the time amplifier 320 allows the stop signal Tstop to pass through the n inverters 306 of the LSB determiner 330, and inputs the first rising edge, that occurs after activation of the stop signal Tstop, into the n latches 307.

With respect to the amplified time interval, rising edges of an amplified start signal $t_{start}^*$ are counted using the adder 308 until an amplified stop signal $t_{stop}^*$ is activated, and the counted result is output.

A time interval that could not be detected in addition to most significant bits, that is, a micro-time interval that could not be counted in a quantized range, is quantized more precisely, which produces the same results as if the resolution of the TDC is improved.

However, in practice, the time amplifying devices 304 is a circuit highly sensitive to PVT variations, and thus there is a need for a calibration circuit to correct the PVT variations.

Further, the use of a large number of delay elements may cause jitters and mismatches between the delay elements. Jitter may be the deviation from true periodicity of a presumed periodic signal.

Figure 5:
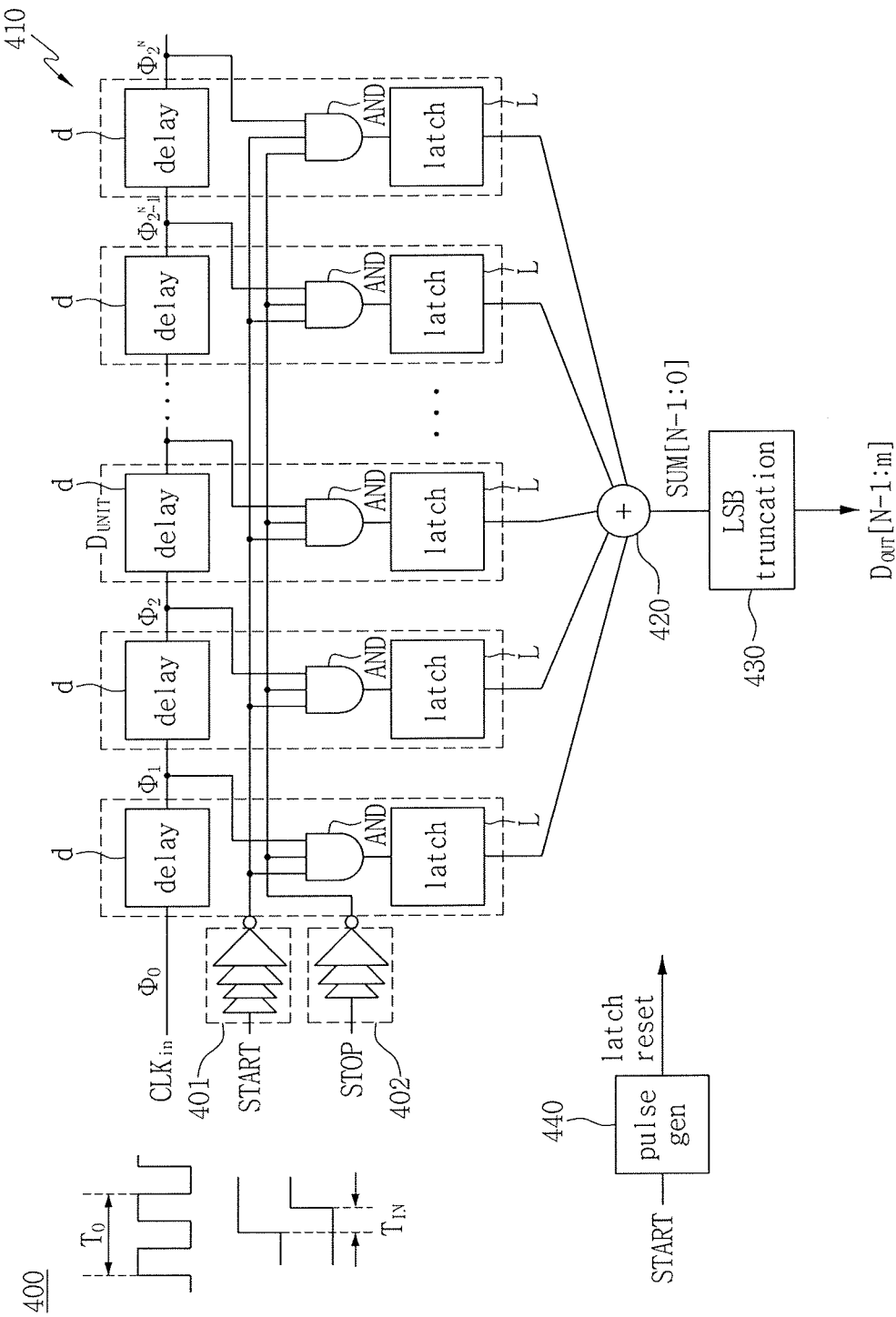
FIG. 5 is a circuit diagram of a TDC according to an exemplary embodiment of the inventive concept.

FIG. 5 is a circuit diagram of a TDC 400 according to exemplary an embodiment of the inventive concept.

The TDC 400 according to an exemplary embodiment of the inventive concept includes a plurality of unit delays $D_{UNIT}$, and by performing a probability distribution operation on an accumulated amount of delay, an ultra-high resolution is implemented.

Referring to FIG. 5, the TDC 400 includes a start signal input device 401, a stop signal input device 402, a unit delay group 410, an adder 420, an LSB truncation device 430 and a pulse generator 440.

The start signal input device 401 may buffer and may provide a start signal START. The start signal input device 401 may be embodied by an even number of inverters, but the configuration of the start signal input device 401 is not limited thereto.

The stop signal input device 402 may buffer and may provide a stop signal STOP. In this case, the stop signal input 402 may be embodied by an odd number of inverters, but the configuration of the stop signal input device 402 is not limited thereto. The start signal input device 401 and the stop signal input device 402 are configured to allow activation sections of a start signal START and a stop signal STOP to overlap each other.

Like the unit delay $D_{UNIT}$ in the unit delay group 410, each unit delay $D_{UNIT}$ includes a delay element d (e.g., an inverter, a buffer, etc.), a logical product operator (e.g., an AND gate) and a latch L.

The delay element d may have a predetermined time delay, for example, Td. A clock signal CLKin having a predetermined period $T_0$ passes through the delay element d.

The delay elements d of the respective unit delays $D_{UNIT}$ are coupled to each other in series, and thus the clock signal CLKin is delayed by a time delay Td whenever passing through a single delay element d.

The logical product operator (e.g., the AND gate) receives a start signal START, a stop signal STOP and an output of a delay element d, and performs an AND operation on the signals to provide a result to the latch L.

The adder 420 counts signals from the respective latches L to provide a total output signal SUM[N−1:0] having bits corresponding in number with the number of the unit delays $D_{UNIT}$.

The LSB truncation device 430 truncates a predetermined number of bits of least significant bits of the total output signal SUM[N−1:0] to generate an output signal $D_{OUT}$[N−1:m].

The pulse generator 440 generates a latch reset signal LATCH RESET in the form of a pulse using a start signal START. Although not mentioned, it should be understood that a latch reset signal LATCH RESET serves to prepare for the next operation by resetting latches L at a predetermined timing. For example, the pulse generator 440 may generate a latch reset signal LATCH RESET having rectangular pulses of a predetermined frequency.

In the operation of the TDC 400 in accordance with the embodiment of the inventive concept, a clock signal CLKin having a predetermined period $T_0$ passes through n delay elements d connected in series. When an original clock signal CLKin is Φ0, a clock signal passing through the first unit delay Dunit is Φ1, and a clock signal passing through the next unit delay is Φ2.

The clock signals Φ0, Φ1 Φ2, etc. are continuously transmitted through the delay elements d in an initial operation such as a power-up sequence.

Figure 6:
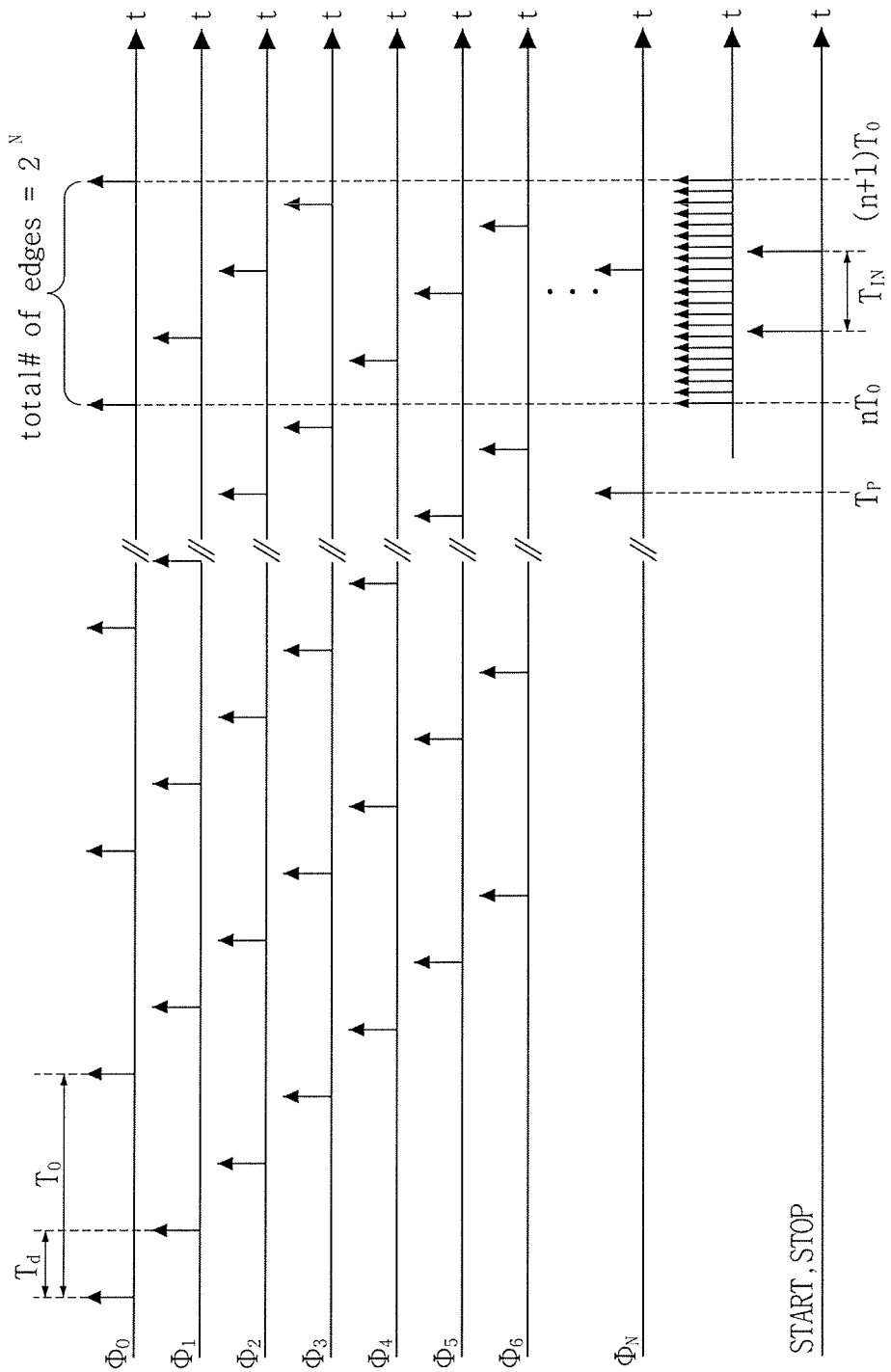
FIG. 6 is a diagram illustrating rising edges of clocks of FIG. 5.

FIG. 6 is a diagram illustrating rising edges of clock signals Φ0, Φ1, Φ2, etc. of FIG. 5.

Referring to FIG. 6, when an original clock signal CLKin is Φ0, rising edges (indicated as arrows) of the clock signal have an interval, that is, a period of $T_0$.

A first rising edge of a predetermined-time delayed clock signal Φ1 is delayed from a first rising edge of the original clock signal Φ0 by a predetermined time delay of the delay element d, that is, by Td.

Accordingly, the time at which a first rising edge of the clock signal CLKin arrives by passing through the final delay element d is calculated by Equation 1 below.

$$Tp = N*Td \qquad \text{Equation 1}$$

In Equation 1, Tp is the total propagation time, N is the number of delay elements, and Td is a time delay of a delay element.

Accordingly, when output edges from all delay elements d after an elapse of the total propagation time Tp are summed, $2^N$ edges are obtained within one cycle nTo to (n+1)To of a clock signal CLKin as shown in FIG. 6. The total propagation time Tp may be set corresponding to a power up initialization time.

After the initialization operation has finished, a start signal START and a stop signal STOP are activated. For example, when a start signal START is activated after propagation time Tp, a latch reset signal LATCH RESET resets all the latches L. In an exemplary embodiment, each latch L includes a clear terminal, and the latch reset signal is applied to the clear terminals to reset all the latches L.

The start signal START and the stop signal STOP are provided to have activation intervals thereof overlapping each other after an elapse of a predetermined amount of time by the start signal input device 401 and the stop signal input device 402.

Accordingly, edges included in an interval in which the start signal START and the stop signal STOP are activated, that is, edges included in $T_{IN}$, are input into the respective logical product operators (e.g., the AND gates), and are latched by the respective latches L. The adder 420 may obtain a digital output by summing outputs of all of the latches L.

According to at least one embodiment of the inventive concept, a great number of interpolation edges within a predetermined clock period $T_0$ may be obtained and a high resolution may be implemented without having to minimize a time delay of a delay element d. That is, the embodiment of the inventive concept may generate $2^N$ interpolation edges within one clock period $T_0$, after a predetermined time (for example, after an initialization time) independent of a time delay, and thus a resolution in a time interval $T_{IN}$ desired to be measured is increased. Detailed descriptions thereof will be described with reference to FIGS. 7 and 8.

Referring again to FIG. 5, an operation of the LSB truncation device 430 may include truncating predetermined LSBs of an output of the adder 420. In this case, the number of final target bits is set to m, and at the same time, the linearity of the final output bits is ensured.

According to at least one embodiment of the inventive concept, when the number of the final target bits is set to m, redundant delay elements d are used to output a number of bits larger than m bits. To be described below, the greater the number of delay elements d, the higher the resolution of the output bits provided. In order to ensure the linearity in the time delay calculation, unnecessary range or excessive error occurrence range need not to be included, and thus predetermined LSBs are truncated. Accordingly, the LSB truncation device 430 may truncate predetermined bits among all the bits, such that a desired amount of bits, that is, up to m bits corresponding to target bits, is output. In an exemplary embodiment, the LSB truncation device 430 is embodied by a field programmable gate array, a combination of logic circuits, or a processor.

Unfortunately, as an N bit quantizer, a general TDC has a poor linearity. That's why it is difficult for $2^N$ interpolated phases (edges or times) to be equally distributed in a single clock signal unless the delay is finely controlled.

However, the TDC 400 according to at least one embodiment of the inventive concept implements a probability distribution density function using the mismatch between the delay elements d or jitter characteristics, thereby the linearity of output bits is achieved. In an exemplary embodiment, the probability density function is a function that describes the relative likelihood for a continuous random variable to take on a given value.

Figure 7:
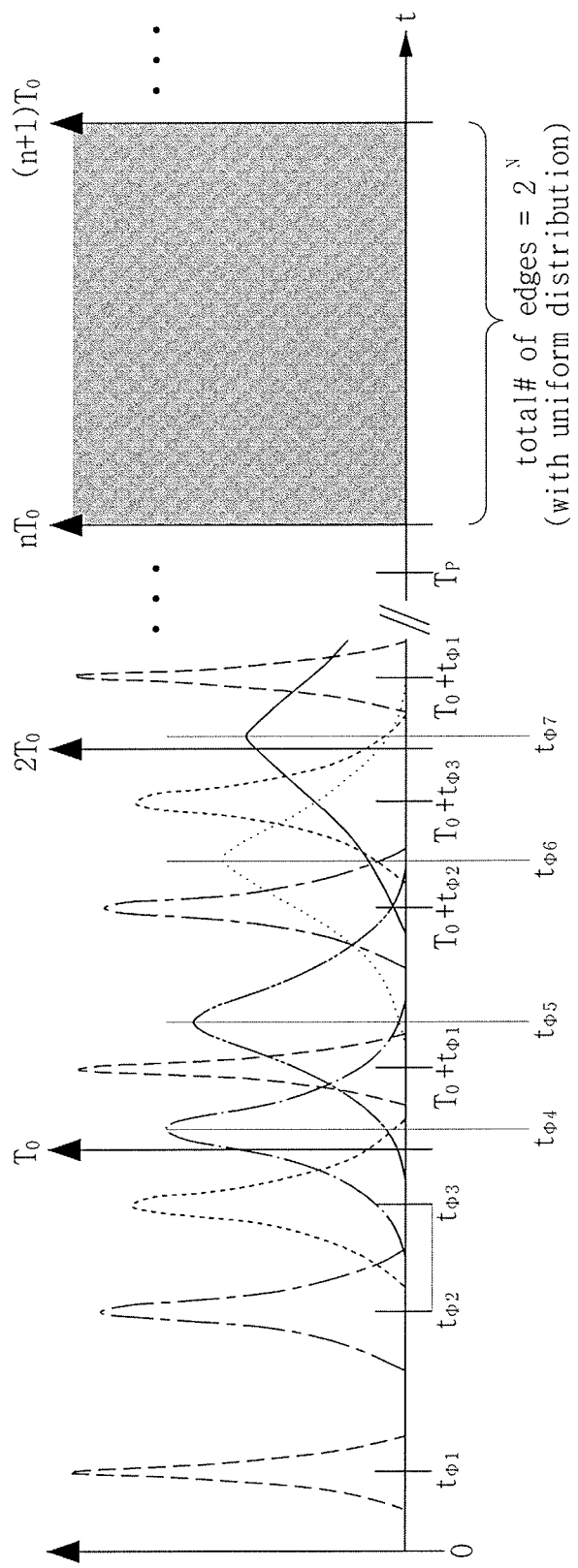
FIG. 7 is a graph illustrating process mismatches between delay elements and accumulated jitter.

FIG. 7 is a graph illustrating process mismatches between delay elements and accumulated jitter.

Referring to FIG. 7, the x-axis represents a process mismatch between delay elements and accumulated jitter of the respective clock signals Φ0, Φ1, Φ2, etc. in a practical chip environment, according to time. That is, in a practical chip environment, the time delays of the respective delay elements are not identical to each other due to the process mismatch. The mismatch of time delay due to the process mismatch may be unavoidable.

With a time of the clock signals Φ0, Φ1, Φ2, etc. passing through the mismatched delay elements, that is, as the clock signals Φ0, Φ1, Φ2, etc. pass through the delay elements, a uniform distribution characteristic is shown. That is, a mismatch of each clock signals Φ0, Φ1, Φ2, etc. shows a Gaussian distribution characteristic.

For example, the determination of the time delay of the delay element by the process mismatch has a static random mismatch characteristic (e.g., a so-called time-invariant error characteristic), which has a Gaussian distribution.

The circuit operation characteristics caused by a jitter effect may be defined as a dynamic random variation (e.g. a so-called time-variant error characteristic). Such a jitter characteristic of a dynamic random variation may have a Gaussian probability density function.

Therefore, as shown in FIG. 7, the mismatch between delay elements and jitter characteristics are gradually accumulated as edges of the clock signal CLKin pass through the delay elements d, and the summation of the edges have more uniformity (see total # of edges=$2^N$ of FIG. 7). However, the probability density function is stable only when N is great enough.

The use of a great number of delay elements d causes a burden due to mismatch between the delay elements d and jitter.

However, according to at least one embodiment of the inventive concept, an excessive number of delay elements d are used so that clock signals influenced by jitter and mismatch are accumulated, and the clock signals are controlled to have a uniform value using a probability distribution and probability density function. For example, when n is 16, the number of bits passing through all the delay elements d is $2^n$, that is, 16000 delay clock signals are generated. Even though such a great number of delay clock signals include mismatch and jitter, the delay clock signals may become uniform when the delay clock signals are calculated as probability density functions and the sum of probability density functions. According to at least one embodiment of the inventive concept, the greater the number of delay elements, the greater the uniformity in the code calculated.

As described above, when a great number of bits, that is, a great number of interpolation edges are obtained, bits in a range of more than a targeted number of bits may be in a low probability occurrence. Accordingly, predetermined LSBs are truncated so that target bits, for example, 10 bits, are controlled to be output.

Figure 8:
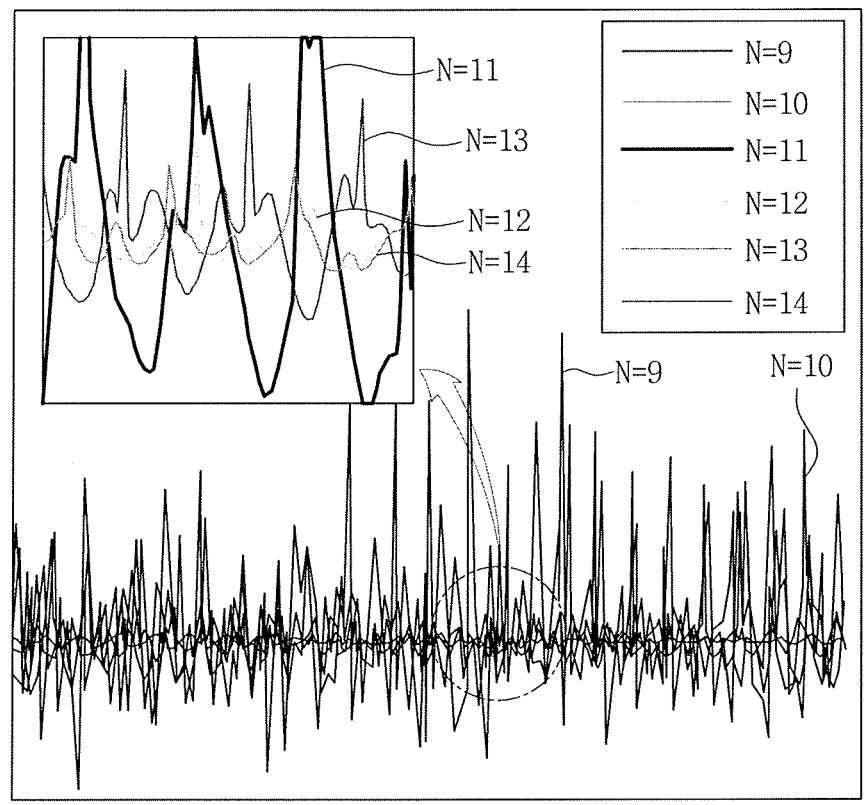
FIG. 8 is a graph illustrating a probability density function for stochastic phase according to the number of delay elements.

FIG. 8 is a graph illustrating a probability density function for stochastic phase according to the number of delay elements.

Referring to FIG. 8, as N is increased, that is, as the number of delay elements d is increased, the probability density function represented by the interpolation edges is uniform.

With this, as the number of delay elements d is increased, the linearity of output values of the TDC 400 is more easily implemented, and a high resolution operation is more easily achieved.

In other words, in accordance with at least one embodiment of the inventive concept, the time delay of the delay element d has no influence on the performance of the TDC 400. The performance of the TDC 400 is determined by setting the number of delay elements d, and inducing a value of the TDC 400 by use of a probability density and a probability distribution.

At least one embodiment of the inventive concept is free from the need to reduce or specify the amount of delay of the delay element d. Therefore, the design may be implemented with an ultra low voltage so power consumption is reduced. In addition, freedom to design placement and routing is ensured using the process mismatch and the accumulated jitters of clocks.

Even when an auto tool is used for layout, the use of the auto layout does not exert an influence on the performance of the TDC 400. In this manner, an additional calibration circuit is not needed, and thus human resources and design time may be reduced.

Figure 9:
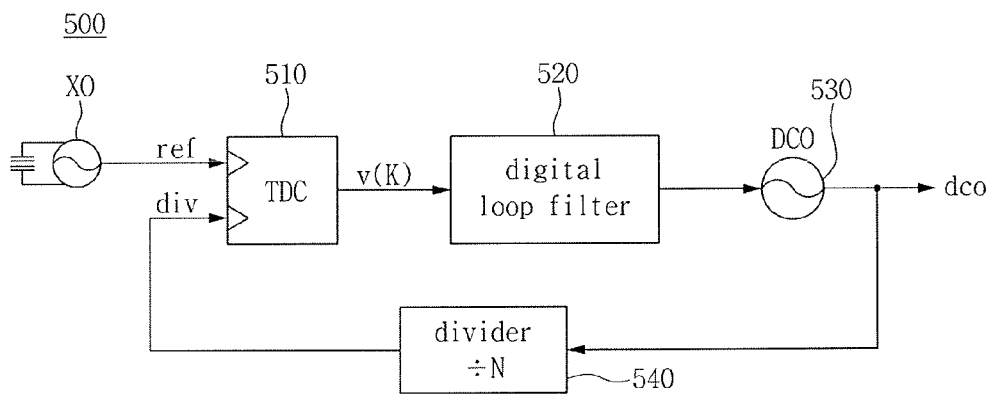
FIG. 9 is a circuit diagram of a digital PLL adopting an embodiment of the inventive concept.

FIG. 9 is a circuit diagram of a digital PLL 500 adopting an exemplary embodiment of the inventive concept.

A digital PLL 500 may include a TDC having a high performance.

The digital PLL 500 may include a TDC 510, a digital loop filter 520, a digitally controlled oscillator (DCO) 530 and a divider 540. In an embodiment, the divider is a voltage divider circuit.

The TDC 510 may receive a reference signal ref and a division signal div from a crystal oscillator XO and the divider 540, respectively, and may output the number of phases within a time interval between the two signals as a digital code (e.g., v(K)). The TDC 510 may be provided using the TDC 400 of FIG. 5. In an exemplary embodiment, the reference signal is the start signal and the division signal div is the stop signal.

The digital loop filter 520 filters a phase error signal of the TDC 510, and provides the filtered phase error signal.

The DCO 530 oscillates the filtered signal to generate an oscillated signal dco.

The divider 540 divides the oscillated signal dco by N to generate a division signal div, where N can be a number greater than 1.

Figure 10:
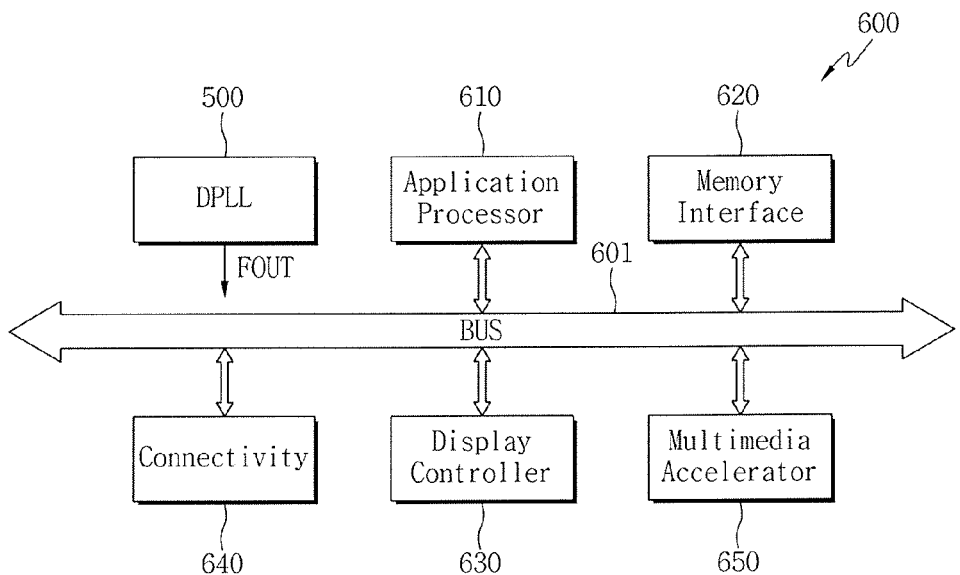
FIG. 10 is a block diagram illustrating a portable electronic apparatus including a TDC according to an exemplary embodiment of the inventive concept.

FIG. 10 is a block diagram illustrating a portable electronic apparatus including the TDC according to an exemplary embodiment of the inventive concept.

Referring to FIGS. 9 and 10, a portable electronic apparatus 600 includes a DPLL 500, an application processor 610, a memory interface 620, a display controller 630, a connectivity device 640 and a multimedia accelerator 650.

The portable electronic apparatus 600 may be implemented using a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, or an e-book.

The application processor 610 may control the memory interface 620, the display controller 630, the connectivity device 640 and the multimedia accelerator 650 through a bus 601.

The memory interface 620 may include an internal memory device, and may include a memory controller allowing an interface with an external memory device.

The display controller 630 may transmit the display data to the display to be displayed on the display.

The connectivity device 640 may include a general purpose input/output (GPIO) interface, a serial peripheral interface (SPI) bus and/or a Universal Serial Bus on-the-go (USB OTG).

The multimedia accelerator 650 may include a camera interface, a multi format CODEC, a video pre/post processor and/or JPEG.

The DPLL 500 including a circuit based on the TDC in accordance with at least one embodiment of the inventive concept and a portable electronic apparatus including the DPLL 500 may have increased resolution and lower power consumption.

According to at least one embodiment of the inventive concept, the TDC is provided with a sufficient number of delay elements, and thus mismatches between the delay elements and jitter effects are accumulated so that the TDC is controlled to have a constant output characteristic. Accordingly, a high resolution can be implemented regardless of a time delay of the delay element.

At least one embodiment of the inventive concept is applicable to a TDC, and more particularly to a TDC in a digital PLL circuit.

While the inventive concept has been described with reference to exemplary embodiments, it will be understood by those skilled in the art that various changes and modifications may be made without departing from the spirit and scope of the inventive concept. Accordingly, all such modifications are intended to be included within the scope of this inventive concept.

What is claimed is:

1. A time-to-digital converter, comprising:
    a plurality of delay circuits;
    an adder configured to count outputs of the delay circuits; and
    a least significant bit (LSB) truncation circuit configured to truncate a predetermined number of LSBs from a result output by the adder,
    wherein the time-to-digital converter is configured to determine a time interval between a start signal and a stop signal within one cycle of a clock signal having a predetermined period.

2. The time-to-digital converter according to claim 1, wherein the delay circuits are connected in series.

3. The time-to-digital converter according to 2, wherein each delay circuit comprises:
    a delay element having a predetermined time delay;
    a logical product operator configured to perform an operation on an output of the delay element, the start signal, and the stop signal, and output a result of the operation; and
    a latch configured to latch the output of the logical product operator.

4. The time-to-digital converter according to claim 3, wherein the clock signal is configured to pass through each delay element.

5. The time-to-digital converter according to claim 2, wherein the delay circuits generate a number of target bits and the converter further comprises a redundant delay element to output bits more than the number of target bits.

6. A time-to-digital converter, comprising:
    a plurality of delay elements configured to transmit a clock signal having a predetermined period;
    a plurality of logical product operators connected to outputs of the plurality of delay elements, respectively;
    a plurality of latches configured to latch an output of the logical product operators;
    an adder configured to count outputs of the plurality of latches; and
    a least significant bit (LSB) truncation circuit configured to truncate an output of the adder to generate a target number of bits.

7. The time-to-digital converter according to claim 6, wherein the delay elements are connected in series.

8. The time-to-digital converter according to claim 7, wherein the number of the delay elements is larger than the number of target bits.

9. The time-to-digital converter according to claim 7, wherein the adder counts rising edges of delay signals of the clock signal passing through the delay elements in a predetermined interval between a start signal and a stop signal.

10. The time-to-digital converter according to claim 9, wherein the start signal and the stop signal are activated and input after passing through all of the delay elements.

11. The time-to-digital converter according to claim 9, wherein each logical product operator receives and operates on an output of a corresponding one of the delay elements during an interval in which the start signal and the stop signal are activated while overlapping each other.

12. The time-to-digital converter according to claim 9, wherein the number of the rising edges in the period of the clock signal determines a resolution performance of the time-to-digital converter.

13. The time-to-digital converter according to claim 6, wherein each logical product operator is an AND gate.

14. A time-to-digital converter configured to generate a digital code indicating a time interval between a start signal and a stop signal, the time-to-digital converter comprising:
    a plurality of delay elements connected in series;
    a plurality of logic gates, wherein each gate receives the start signal, the stop signal, and an output of a corresponding one of the delay elements;
    a plurality of latches, where each latch receives an output of a corresponding one of the logic gates;
    an adder configured to add outputs of the latches; and
    a circuit configured to truncate an output of the adder to generate the digital code.

15. The time-to-digital converter of claim 14, wherein the number of delay elements is higher than a total bit count of the digital code.

16. The time-to-digital converter of claim 14, wherein a first one of the delay elements receives an input of a clock signal, and the adder adds the outputs during a single cycle of the clock signal.

17. The time-to-digital converter of claim 14, wherein each logic gate is an AND gate.

18. The time-to-digital converter of claim 14, further comprising:
   an even number of delay elements connected in series and configured to output the start signal; and
   an odd number of delay elements connected in series and configured to output the stop signal.

19. A digital phase locked loop (PLL) comprising the time-to-digital converter of claim 14.

20. The digital PLL of claim 19, further comprising:
   a digital loop filter receiving an output of the time-to-digital converter;
   a digital controlled oscillator (DCO) receiving an output of the digital loop filter;
   a divider circuit performing a division on an output of the DCO to generated a divided signal for output to the time-to-digital converter; and
   a crystal oscillator applying a reference signal to the time-to-digital-converter.

\* \* \* \* \*